(12) United States Patent
Moutzouris

(10) Patent No.: US 11,378,589 B2
(45) Date of Patent: Jul. 5, 2022

(54) ELECTRONIC MEASURING DEVICE AND METHOD OF USE

(71) Applicant: POKIT INNOVATIONS PTY LTD, North Ryde (AU)

(72) Inventor: Paul Moutzouris, North Ryde (AU)

(73) Assignee: POKIT INNOVATIONS PTY LTD, North Ryde (AU)

( * ) Notice: Subject to any disclaimer, the term of this patent is extended or adjusted under 35 U.S.C. 154(b) by 379 days.

(21) Appl. No.: 16/484,448

(22) PCT Filed: Feb. 6, 2018

(86) PCT No.: PCT/AU2018/000013
§ 371 (c)(1),
(2) Date: Aug. 7, 2019

(87) PCT Pub. No.: WO2018/145143
PCT Pub. Date: Aug. 16, 2018

(65) Prior Publication Data
US 2020/0025798 A1    Jan. 23, 2020

(30) Foreign Application Priority Data

Feb. 7, 2017 (AU) .............................. 2017900370
May 5, 2017 (AU) .............................. 2017901643

(51) Int. Cl.
*G01R 1/067* (2006.01)
*G01R 15/12* (2006.01)
*H04Q 9/00* (2006.01)

(52) U.S. Cl.
CPC ....... *G01R 1/06788* (2013.01); *G01R 15/125* (2013.01); *H04Q 9/00* (2013.01)

(58) Field of Classification Search
CPC ................ G01R 1/06788; G01R 1/073; G01R 1/07357; G01R 1/07364; G01R 1/07371;
(Continued)

(56) References Cited

U.S. PATENT DOCUMENTS

| 6,400,133 B1 | 6/2002 | Vest et al. |
| 8,538,269 B2 | 9/2013 | Blanton et al. |

(Continued)

FOREIGN PATENT DOCUMENTS

WO    2012096240 A1    7/2012

OTHER PUBLICATIONS

ISA Australian Patent Office, International Search Report Issued in Application No. PCT/AU2018/000013, dated May 8, 2018 WIPO, 5 pages.

*Primary Examiner* — Orlando Bousono
(74) *Attorney, Agent, or Firm* — McCoy Russell LLP

(57) ABSTRACT

The invention relates to a measuring device such as a multimeter, comprising a retractable assembly, and including (i) a cable comprising a first end portion having a first probe and a second end portion having a second probe; (ii) a reel comprising a rotatable hub adapted to wind up and unwind said cable; and (iii) a circuit in connection with said cable, the circuit being adapted to wirelessly communicate a signal measured by the first probe or the second probe to a remote location; wherein the circuit is rotatable in conjunction with said rotatable hub.

9 Claims, 9 Drawing Sheets

(58) Field of Classification Search
CPC ............ G01R 1/07378; G01R 1/07392; G01R 15/125; H04Q 9/00; H02G 11/02
See application file for complete search history.

(56) References Cited

U.S. PATENT DOCUMENTS

| | | |
|---|---|---|
| 2002/0040945 A1 | 4/2002 | Stepancich et al. |
| 2004/0129522 A1* | 7/2004 | Skowronski ............ H02G 11/02 191/12.2 R |
| 2004/0256188 A1* | 12/2004 | Harcourt ................ H02G 11/02 191/12.2 A |
| 2005/0236243 A1* | 10/2005 | Huang ................... H02G 11/02 191/12.4 |
| 2006/0028198 A1 | 2/2006 | Hoopengarner |
| 2009/0267590 A1* | 10/2009 | Atta ................... G01R 1/06788 324/149 |
| 2015/0034752 A1 | 2/2015 | Homar |
| 2016/0295312 A1* | 10/2016 | Merenda ................ A45C 15/00 |

* cited by examiner

ELECTRONIC MEASURING DEVICE AND METHOD OF USE

CROSS-REFERENCE TO RELATED APPLICATIONS

The present application is a U.S. National Phase of International Patent Application Serial No. PCT/AU2018/000013 entitled "ELECTRONIC MEASURING DEVICE AND METHOD OF USE," filed on Feb. 6, 2018. International Patent Application Serial No. PCT/AU2018/000013 claims priority to Australian Patent Application No. 2017900370 filed on Feb. 7, 2017 and Australian Patent Application No. 2017901643 filed on May 5, 2017. The entire contents of each of the above-referenced applications are hereby incorporated by reference for all purposes.

TECHNICAL FIELD

The present invention relates to the field of electronics, or more particularly electronic measuring devices.

In one form, the invention relates to a device capable of measuring quantities, such as voltage, resistance and current in an electrical circuit or other quantities or qualities such as vibration, acoustic energy and lighting levels.

In one particular aspect the present invention is suitable for use as a multimeter and digital oscilloscope It will be convenient to hereinafter describe the invention in relation to multimeters or electric circuit analysers however, it should be appreciated that the present invention is not limited to that use only and can be used to measure quantities other than those associated with an electrical circuit. These include, but are not limited to, vibration, acoustic energy, light levels or pH.

BACKGROUND AND SUMMARY

It is to be appreciated that any discussion of documents, devices, acts or knowledge in this specification is included to explain the context of the present invention. Further, the discussion throughout this specification comes about due to the realisation of the inventor and/or the identification of certain related art problems by the inventor. Moreover, any discussion of material such as documents, devices, acts or knowledge in this specification is included to explain the context of the invention in terms of the inventor's knowledge and experience and, accordingly, any such discussion should not be taken as an admission that any of the material forms part of the prior art base or the common general knowledge in the relevant art in Australia, or elsewhere, on or before the priority date of the disclosure and claims herein.

Multimeters—also known as circuit analysers or VOMs (Volt-Ohm-Milliammeters)—are electronic instruments capable of multiple functions such as measuring voltage, current, resistance and less commonly, characteristics such as capacitance, conductance, decibels, duty cycle, frequency, inductance and temperature.

Multimeters range in size from hand-held devices for basic fault finding and field service work, to bench-scale instruments which measure with a high degree of accuracy. They are used for investigating electrical problems in a wide array of industrial and household devices such as electronic equipment, motor controls, domestic appliances, power supplies, and wiring systems.

Multimeters include probes adapted to record characteristics such as current flow, resistance, voltages, light level, sound pressure level, acidity/alkalinity (pH) and relative humidity. Many different types of probes may be used to attach to the circuit or device under test. Typically, all probes include a pair of connectors (such as a crocodile clips, retractable hook clips or pointed probes) attached to one end of a flexible, well insulated lead in electrical connection with the circuitry of the multimeter.

In a digital multimeter the signal under test is detected up by probes and converted to a voltage before an amplifier with electronically controlled gain preconditions the signal. A digital multimeter displays the quantity measured as a number, and may also provide a graphical representation (such as a bar graph) or a signal on a low bandwidth oscilloscope.

Modern digital multimeters may have an embedded computer, which provides a wealth of convenient features, but the requisite hardware adds size and weight and is usually limited to bench-scale multimeters. However, bench size multimeters usually use mains power and this can have the disadvantage of voltage from the multimeter distorting measurements in circuits under test. Accordingly, hand-held multimeters are often preferred but to maintain their portability they have limited measurement and display features.

One such limitation of measurement by multimeters pertains to voltage. For example, regulations in some countries limit multimeters to measuring extra low voltages, that is, less than 60 Volts unless certified according to electrical safety standards. To cope with measuring higher voltages and comply with certification criteria, the probes must be more substantial, internal components must be larger and internal creepage and clearance rules must be satisfied. This is in conflict with desirable features of a hand-held device such as small size and low weight to aid portability.

Attempts have been made in the past to overcome these drawbacks. For example, U.S. Pat. No. 8,538,269 (Blanton et al) relates to an adapter for providing wireless communication between a digital multimeter and a computer. The adapter has a processor, a transmitter and a receiver to communicate signals between the digital multimeter and the processor. The adaptor is plugged into a computer and transfers information via a universal serial bus (USB) to universal asynchronous receive/transmit (UART) bridge.

There is therefore a need for a multimeter that combines the portability and convenience of a hand held device with the ability to access multiple features.

An object of the present invention is to provide a measuring device, preferably a multimeter device that is small, economical to manufacture and compact.

Another object of the present invention is to provide a device that can wirelessly feed measurement data to a remote location for analysis.

A further object of the present invention is to alleviate at least one disadvantage associated with the related art.

It is an object of the embodiments described herein to overcome or alleviate at least one of the above noted drawbacks of related art systems or to at least provide a useful alternative to related art systems.

In a first aspect of embodiments described herein there is provided a measuring device, preferably a multimeter, comprising a retractable assembly, the device including:
(i) a cable comprising:
    a first end portion having a first probe; and
    a second end portion having a second probe;
(ii) a reel comprising a rotatable hub adapted to wind up and unwind said cable;

(iii) a circuit in connection with said cable, said circuit being adapted to wirelessly communicate a signal measured by the first probe or the second probe to a remote location; wherein the circuit is rotatable in conjunction with said rotatable hub.

Case

The retractable assembly of the multimeter may further include a case in which said reel is mounted, the case having at least one opening out through which extends the first end portion or second end portion of the cable. Preferably the case has two openings separated by about 180°, each end of the cable projecting from an opening.

Preferably the case is generally circular in cross section, having a disk-like shape. However, it will be readily apparent that other shapes will be suitable. It is also preferably small enough to fit in a user's pocket and for example, attached to a key ring.

Reel Operation and Retention

Preferably the reel includes a biasing means to urge the reel to wind up the cable.

Preferably the reel further includes a retainer to control the proportion of elongated cable that is wound up or unwound. For example, the retainer may comprise a releasable ratchet assembly to retain said reel in a releasable fixed position so that similar lengths of said first and second end portions of said elongated connection remain extended from the case.

For example, the reel may comprise a rotatable cylindrical hub (on which the cable is wound and unwound) with at least one circular flange, and a retainer including:

a releasable ratchet assembly to retain the reel in a releasable fixed position, said releasable ratchet assembly having:

a pawl positioned for engagement with the reel to prevent the biasing means from urging the reel to wind up the elongated cable;

elastic means to bias said pawl toward said reel; and a pawl release to allow manual movement of the pawl out of engagement with the reel whereby the biasing means can urge the reel to wind up the cable.

Typically, the circular flange has a circular outer or inner edge with one or more detents or teeth which engages with the pawl of the releasable ratchet assembly.

Circuit

The circuit may be an electronic circuit of any type well known in the art and is preferably of low cost, high performance, large capacity, small size and minimal power consumption. Typically, the circuit is included in a printed circuit board.

A small battery may be included in the multimeter to power the circuit.

The circuit is rotatable in conjunction with the reel for the cable and probes, simplifying manufacture and allowing enormous flexibility in the use of the device.

The circuit wirelessly communicates a signal from the probes to a wireless compatible device such as, for example, a smartphone, watch, portable computer or tablet computer.

The circuit may include at least one radio transmitter or receiver operable to communicate wirelessly with a compatible device in one or more communication protocols such as Zigbee, WiFi, Infrared data Association (IrDA), Bluetooth, ultra-wideband (UWA) and Z-wave.

For example, the circuit may be adapted to communicate by wireless local area networking (WiFi) using IEEE 802.11 standards over short or long distances. Wi-Fi most commonly uses the 2.4 gigahertz UHF and 5 gigahertz SHF ISM radio bands. The circuit may for example, be used to connect to the Internet by a wireless network, typically via a wireless access point ("hotspot"). Alternatively, the circuit may operate in ad-hoc mode, communicating directly to a device.

Alternatively, or in addition, the circuit may communicate over short range by Bluetooth—a wireless technology standard for exchanging data over short distances using short-wavelength UHF radio waves in the ISM band from 2.4 to 2.485 GHz.

Typically, Wi-Fi communication is preferred for applications that are access point-centered, with an asymmetrical client-server connection and all traffic routed through the access point. Conversely Bluetooth is usually symmetrical, between two Bluetooth devices. Bluetooth serves well in simple applications where two devices need to connect with minimal configuration while Wi-Fi is better suited to applications where some degree of client configuration is desirable and high speeds are required. However, Bluetooth access points do exist and ad-hoc connections are possible with Wi-Fi though not as simply as with Bluetooth.

Preferably the circuit used in the device of the present invention comprises:

a processor, a transmitter operable for transmitting signals from the processor to a wireless compatible device at the remote location;

a receiver operable for receiving signals from the wireless compatible device, the processor operable for receiving signals from the receiver; and at least one transmitter operable for providing wireless communication between the processor and the wireless compatible device such that signals from the probes are transferred wirelessly to the wireless compatible device by the transmitter.

The wireless compatible device may further include any suitable and necessary hardware known to those skilled in the art such as an interrogator for transfer of signals or data storage means or a multiplexer. Where used herein the term 'signal' is used herein it is intended to refer to any electric current or electromagnetic field used to convey data from the probe via the cable.

Software Application

The circuit wirelessly communicates a signal measured by the first probe or the second probe to a remote location of a wireless compatible device such as a smartphone, watch, portable computer or tablet computer.

In a second aspect of the present invention described herein there is provided computer implemented system for measurement and presentation of a signal, the system comprising:

the device of the present invention a wireless compatible device at the remote location for receiving the signal communicated from the circuit, and a software application for processing the signal and creating an output for display on a graphic user interface of the wireless compatible device.

The wireless compatible device will include software applications that use the signal as input and perform processing tasks for the computer user. The resultant output may be displayed on the wireless compatible device in digital or graphic form using a graphic user interface.

In a further aspect of embodiments of the present invention there is provided a non-transitory computer readable storage medium for storing an application for executing a method of presenting information, the method including the steps of:

(1) receiving via a wireless compatible device, a signal communicated from the device of claim 1; and (2) processing the signal and creating an output for display on a graphic user interface of the wireless compatible device.

In the case of smart phones and other mobile devices the software application will be in the form of a mobile app. It will be apparent to the person skilled in the art that desktop applications that run on desktop computers and web applications which run in mobile web browsers are other types of software application that could be used with the present invention.

A single device of the present invention may operate with a number of different software applications depending on the nature of the test measurement and the nature of the probe being used. Thus, the device of the present invention can be used for multiple purposes.

Probes

The multimeter may use any test probes suitable for the signal being measured. For example, crocodile clips, retractable hook clips, and pointed probes are the three most common types for connection to an electrical circuit or device under test. Tweezer probes are used for closely spaced test points, such as those found on surface-mount devices. When pH is being measured (such as pH in water or soil) the probes may comprise two electrodes—at least one comprising a rod-like structure made of glass with a bulb containing a sensor at the bottom.

Preferably the ends of the cable of the present invention are adapted to be rapidly changed between different types of probes and are not limited to a single purpose. The probes may also be adapted to act a plugs for extension leads.

In a preferred embodiment, the probes can be retracted into the case when not in use. In a particularly preferred embodiment, the probes are configured so that they can be incorporated into the case when not in use.

Adaptor and Auxiliary Probes

The present invention also provides an adaptor for a measuring device, the adaptor comprising:

a holder for removable attachment to the measuring device, a first auxiliary probe and a second auxiliary probe, wherein the first auxiliary probe and second auxiliary probe are adapted for electrical connection with a first probe and second probe of the measuring device In a particularly preferred embodiment there is provided an adaptor for the measuring device of the present invention, the adaptor comprising:

a holder for removable attachment to the measuring device, preferably a case enclosing the measuring device, a first auxiliary probe and a second auxiliary probe, wherein the first auxiliary probe and second auxiliary probe are in electrical connection with the retracted first probe and second probe when the holder is attached to the case of the device and the reel is wound up.

The aforementioned auxiliary probes may perform any useful role. For example, the auxiliary probes may perform any general probe function, such as measuring temperature or pH or some other quantity. The auxiliary probes may alternatively be adapted for connection to extension leads. However, in a particularly preferred embodiment the adaptor is used to modify the signal detected by the first and second probes, such as voltage.

For example, if the first and second probes are limited to measuring extra low voltages (eg <60V) the auxiliary probes may have integral high voltage resistors which step down high voltages measured to extra low voltages (eg 600V down to 60V). This has the advantage that only the auxiliary probes need be certified to relevant electrical safety requirements such as creepage and clearance rules for measuring high voltage.

Preferably the holder associated with the auxiliary probes is held adjacent the case. It is particularly preferred that the adaptor and measuring device become integral. This may be achieved by any convenient means such as, for example, by interference fit or snap fit. In one preferred embodiment, the case of the device is partially enclosed by flexible prongs on the holder that form a claw-like grip. It is important that the holder is securely held to the case to ensure good electrical contact yet can also be quickly attached and detached manually, without the use of tools.

Cable

The cable may be of any type known in the art as suitable for transmitting signals associated with making measurements. Typically, the cable is an insulated multi-strand wire electrical cable. Alternatively, the assembly may be wound with optical cable instead of electrical ones.

The cable of the present invention is typically composed of two lengths of cable, each independently in communication with the circuit and which winds up and unwinds from the reel as if it were a single length.

Method

In another aspect of embodiments described herein there is provided a method of measuring using the device of the present invention including the steps of;

(1) unwinding the cable from the reel by rotating the hub and the circuit, (2) applying the first probe and the second probe to a location under test to measure a signal, (3) wirelessly communicating the signal measured to a wireless compatible device at a remote location.

Typically, the method of the present invention includes the further step of using a software application loaded on the wireless compatible device to process the signal.

Other aspects and preferred forms are disclosed in the specification and/or defined in the appended claims, forming a part of the description of the invention.

In essence, embodiments of the present invention stem from the realization that incorporating a circuit into the mechanism that winds and unwinds a cable and probes of a multimeter, could provide a hitherto unrecognised flexibility for electronic measurement. Furthermore, incorporating the circuit into the mechanism so that it rotates with the reel allows the device to be made in a compact, inexpensive form which is potentially disposable.

Advantages provided by the present invention comprise the following:

provides an inexpensive, disposable measuring device, provides a more compact, lightweight, portable device;

provides a device that does not have rotating electrical connections and so is more reliable;

provides a device that has the convenience of retractable leads, which is more convenient for transportation and storage;

operation of the device can be interfaced with a wide range of software applications;

is not limited to a single purpose of narrow group of purposes;

does not generate stray currents;

can communicate measurement signals to anywhere and over any distance where there is wireless communication, is compatible with any wireless compatible device loaded with an appropriate software application.

Further scope of applicability of embodiments of the present invention will become apparent from the detailed description given hereinafter. However, it should be understood that the detailed description and specific examples, while indicating preferred embodiments of the invention, are given by way of illustration only, since various changes and modifications within the spirit and scope of the disclosure herein will become apparent to those skilled in the art from this detailed description.

BRIEF DESCRIPTION OF THE DRAWINGS

Further disclosure, objects, advantages and aspects of preferred and other embodiments of the present application may be better understood by those skilled in the relevant art by reference to the following description of embodiments taken in conjunction with the accompanying drawings, which are given by way of illustration only, and thus are not limitative of the disclosure herein, and in which.

LIST OF PARTS

The following list of reference numbers used in the illustrations are for ease of reference and are not intended to limit the disclosure herein:

DETAILED DESCRIPTION

Figure 1:
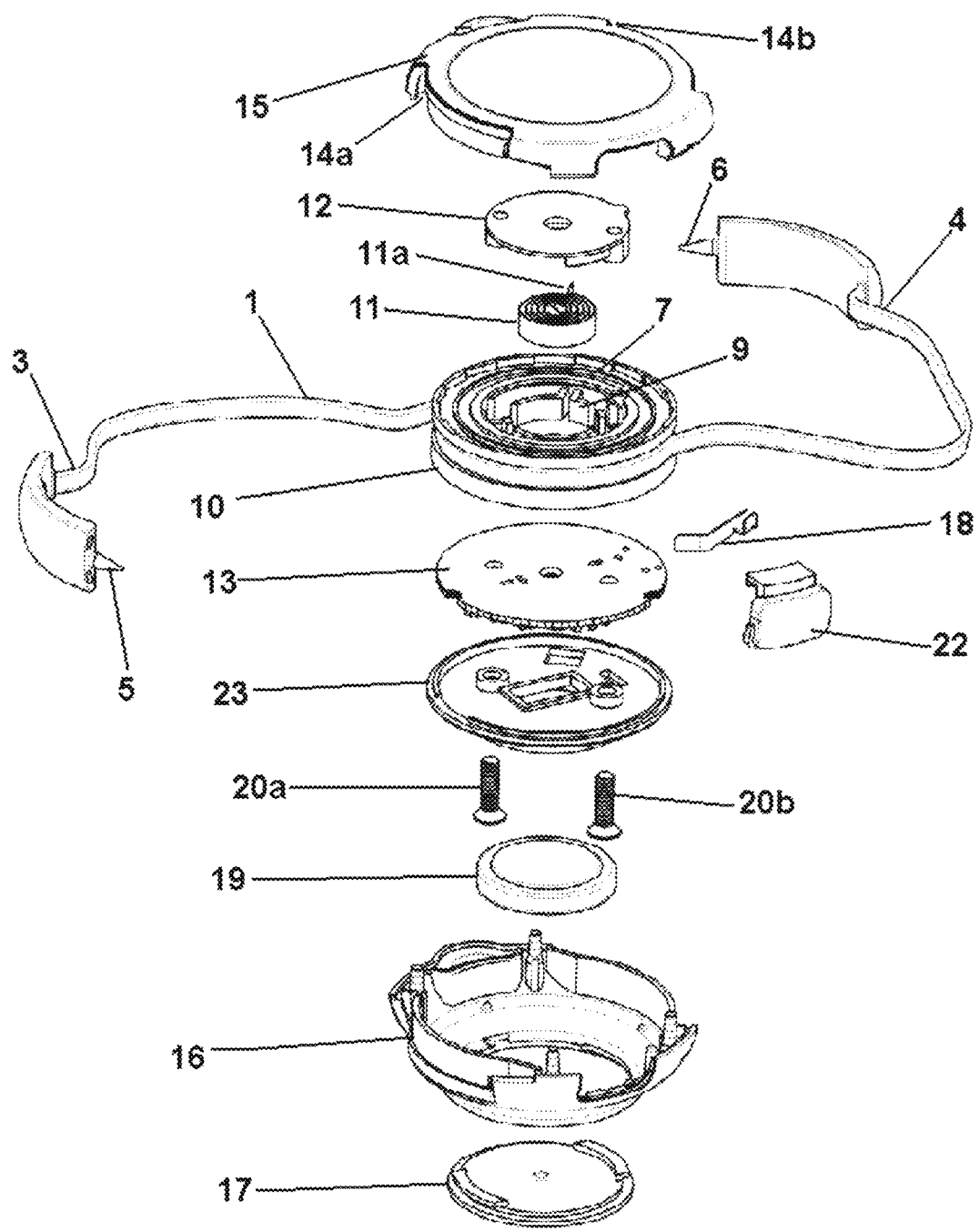
FIG. 1 illustrates a measuring device in the form of a multimeter according to the present invention in exploded view.
Figure 2:
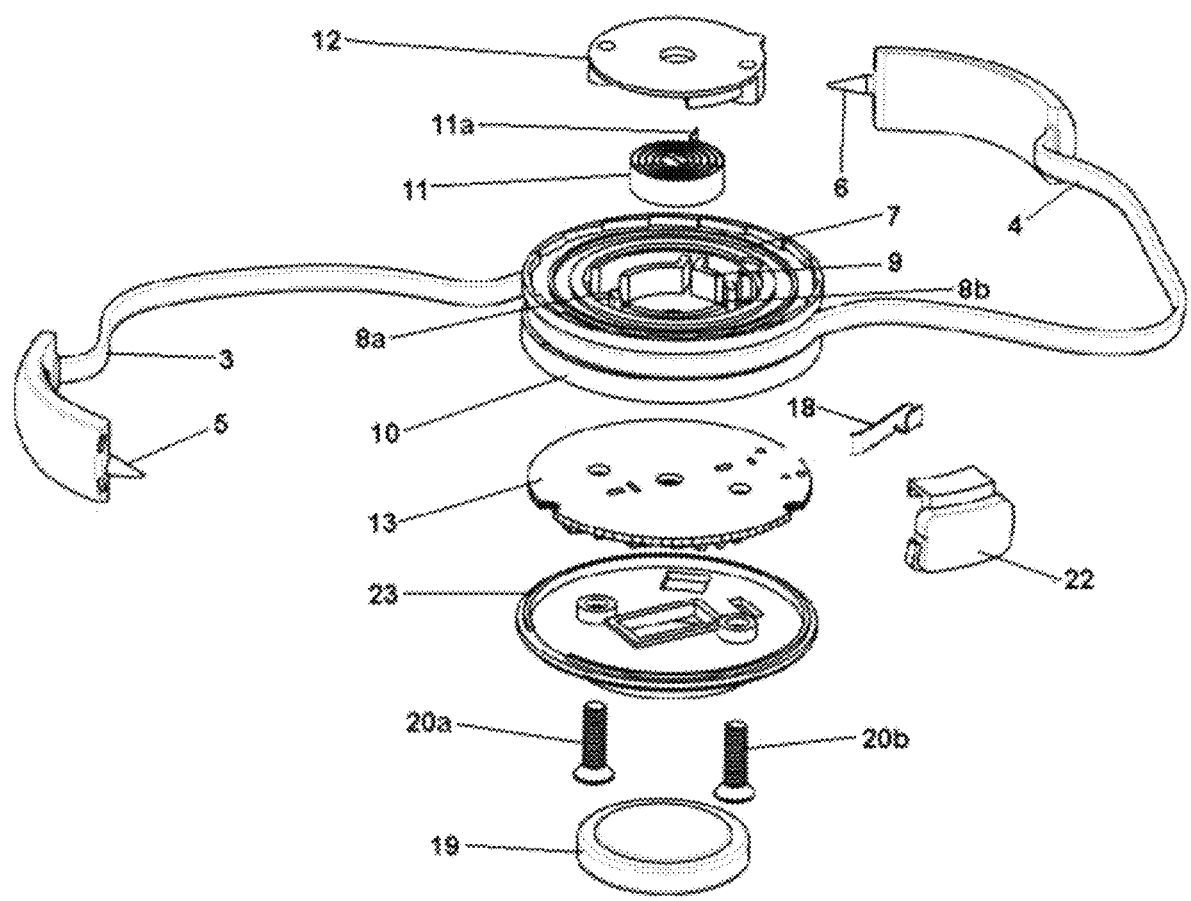
FIG. 2 illustrates the internal elements of the multimeter of FIG. 1 in greater detail.
Figure 3:
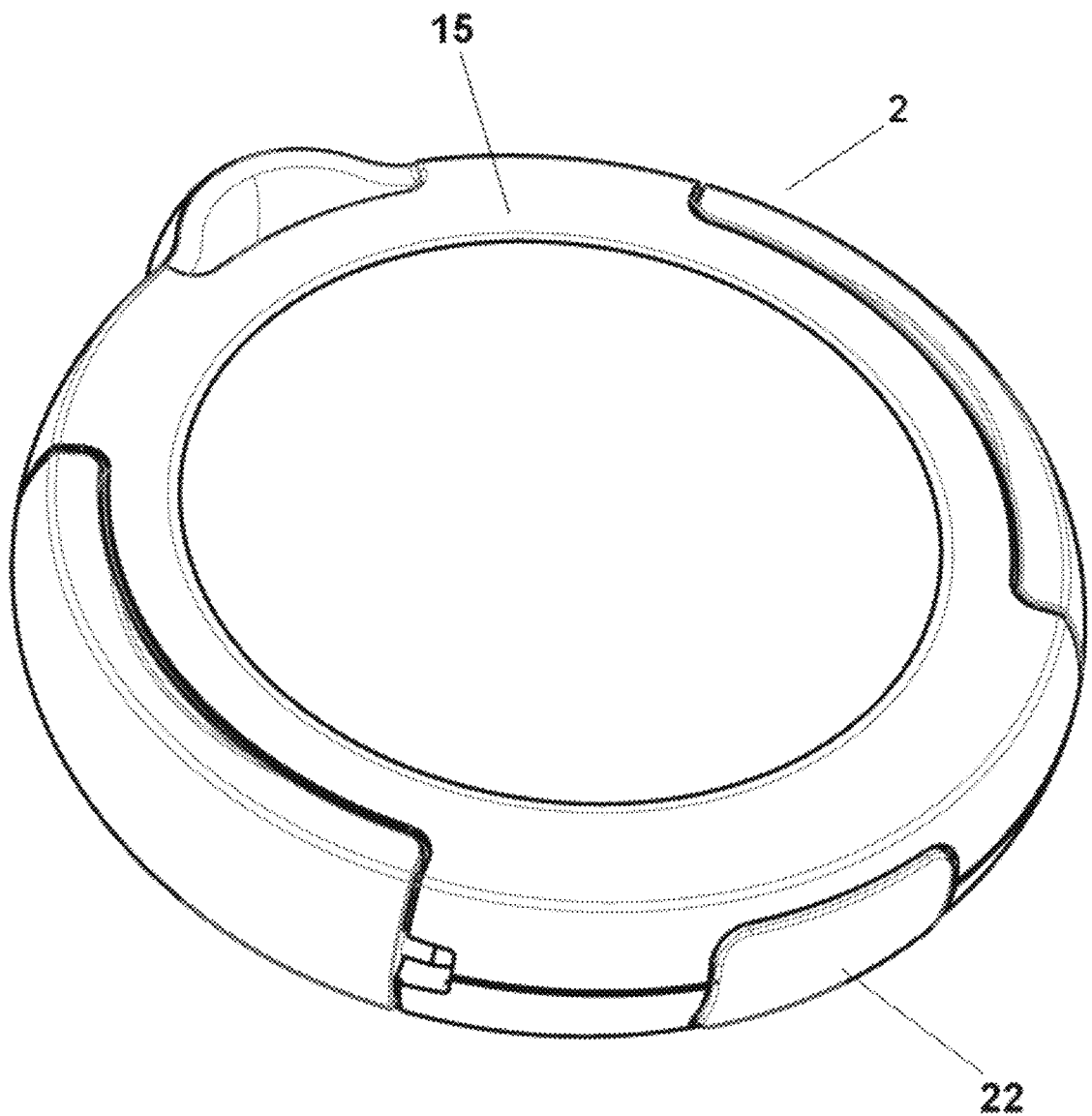
FIG. 3 illustrates a top view of the assembled multimeter of FIG. 1.

Referring to the drawings, more particularly by reference numbers, FIG. 1 illustrates a multimeter according to the present invention in exploded view showing various elements.

The multimeter includes an upper case body 15 and lower case body 16 and lower case closure 17. When assembled the case components 15, 16 and 17 define a generally cylindrical interior cavity and two case openings 14a, 14b. When not in use, the probes 5,6 are received into complementary shaped recesses in the assembled case so that the case is a neat, disk shape with no sharp or angular projections. As such it can be easily stored in a user's pocket and is small enough to be attached to a key ring or a handy shackle such as a carabiner clip and hung on a belt.

A reel 7 has a closed side formed by a generally circular flange 10, and a generally cylindrical reel hub 9 is rotatably mounted in the interior cavity. The hub 9 includes a pair of spaced slots 8a,8b through which the cable 1 is retained. The first end portion 3 and second end portion 4 of the cable 1 extend through the opposite openings 14a,14b and each are attached to their respective probes 5, 6. A biasing means in the form of a coil spring 11 connects to a recess in the hub 9 via a tang 11a to bias the reel 7.

In use the case component 16 includes a post about which the reel rotates. The post is split along part of its length and a tang in the centre of the spring 11 associated with the reel hub slots into the post. In this embodiment the measuring device 2 of the present invention includes a light emitting diode (LED) adjacent the post. When the post is manufactured of clear or semi-opaque material, it acts as a light guide from the circuit 13 and the light is visible on the outside of case component 16 when the battery is charged. Since the post is in the centre of the measuring device 2 the light stays in a constant position even when the LED rotates with the circuit 13.

The circuit is comprised within a printed circuit board 13 which is fixed to the reel 7, preferably by screws 20a, 20b. The screws 20a,20b are fixed into the retainer 12 for the biasing means and sandwich together the retainer 12, the reel flange 10, printed circuit board 13 and lower retainer 23. Thus one set of screws keeps the printed circuit board 13 and spring 18 in place. The printed circuit board 13 includes slots which mate with the reel flange 10 affixing it so that the circuit 13 rotates with the reel 7.

| 1 | Cable | 2 | Measuring device |
|---|---|---|---|
| 3 | First end portion of cable | 4 | Second end portion of cable |
| 5 | First probe | 6 | Second probe |
| 7 | Reel | 8a, 8b | Spaced slots in hub |
| 9 | Hub of reel | 10 | Flange of reel |
| 11 | Biasing means | 12 | Retainer for biasing means |
| 11a | Tang on biasing means | | |
| 13 | Printed circuit board | 14a, 14b | Case openings |
| 15 | Upper case body | 16 | Lower case body |
| 17 | Lower case closure | 18 | Spring |
| 19 | Battery | 20a, 20b | Fixings |
| | | 22 | Pawl release (button) |
| 23 | Lower retainer | 24 | Pawl |
| 25 | Ratchet teeth on reel | 26 | Adaptor |
| 27 | First auxiliary probe | 28 | Second auxiliary probe |
| | | 30 | Holder |
| 31 | First auxiliary probe cable | 32 | Second auxiliary probe cable |
| | | 34a, 34b, 34c, 34d | Flexible prongs |
| | | 36 | Electrical contact between 5 and 31 |
| 37 | Electrical contact between 6 and 32 | | |

The battery 19 is pushed down and held in contact with contacts on the printed circuit board by the lower case closure 17. The case closure 17 includes a small projection on which the battery 19 spins. The battery contacts (not shown in these illustrations) on the printed circuit board 13 adjacent the battery 19 is resiliently flexible (springy) and this maintains positive contact with the battery 19. The battery 19 thus rotates with the reel 7.

In its normal position the cable 1 is wound around the reel hub 7. When a length of cable 1 is desired, pulling on either or both ends 3 and 4 of the cable 1 extends the cable 1 out of the openings 14a, 14b. Typically, the cable 1 consists of two separate lengths that are wound on top of each other (in a spiral) as the reel 7 rotates under the force of the biasing means 11 which in this embodiment is a coil spring. Pulling the end portion 3, 4 of either cable overcomes the bias imparted by the coil spring 11, the reel 7 rotates, the cable 1 unwinds and the biasing means 11 is further tensioned. The reel 7 position is maintained by a pawl 24 biased by the spring 18 into engagement with one of multiple ratchet teeth 25 on the reel 7. When the button 22 is pressed, the ratchet mechanism is released, unlatching the reel 7 and allowing the biasing means 11 to winds the cable 1 back onto the reel 7.

The printed circuit board 13 is held in place by the lower retainer 23, which is held by two fixing screws to the printed circuit board 13 and the reel 7 and retainer 12. These elements thus rotate as one unit. A battery 19 is in electrical contact with the circuit via contacts on the printed circuit board 13 which protrude through the lower retainer. The battery 19 thus draws power for its functions. The battery 19 is replaceable and readily accessed by unscrewing the lower case closure 17 from the lower case body 16.

In use, the cable 1 is unwound from the reel 7 by pulling on the ends 2,4 of the cable. The probes 5,6 are placed at the test location, such as on a circuit or electrochemical cell. Signals from the probes 5,6 are transmitted along the cable 1 to the circuit 13 which communicates the signal wirelessly to a compatible device loaded with appropriate application software.

Figure 7:
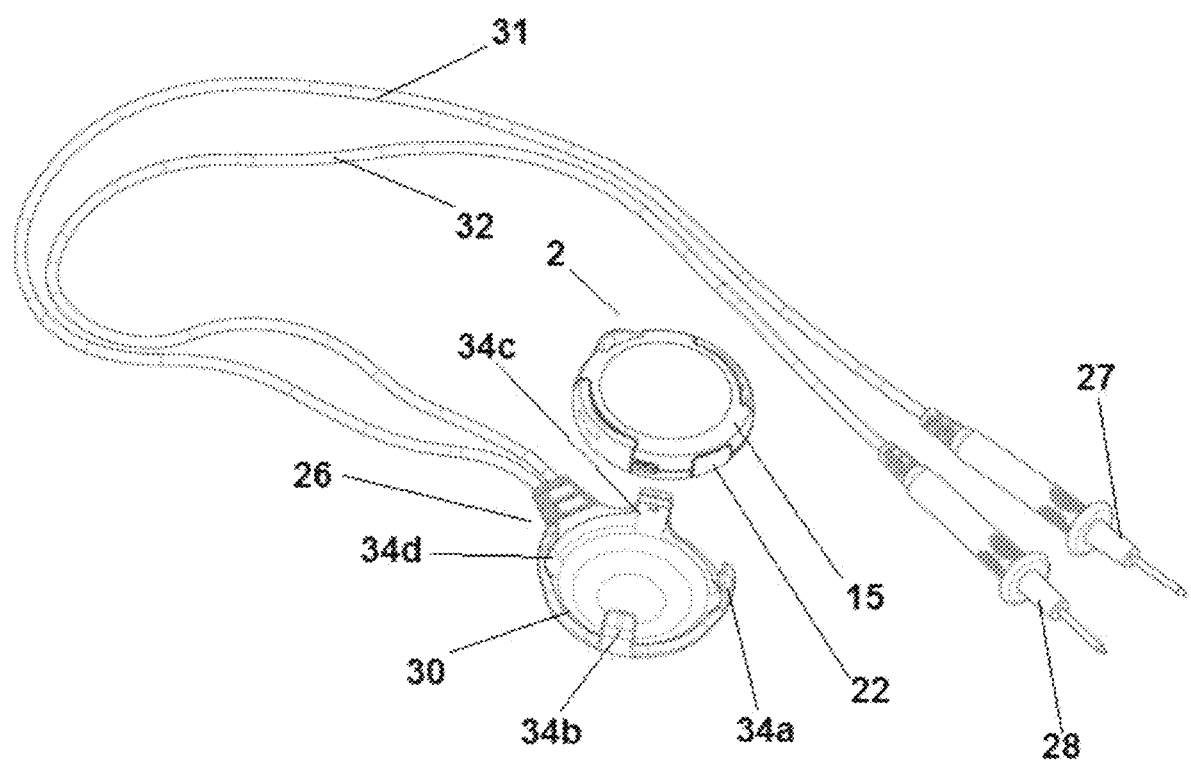
FIG. 7 illustrates the measuring device of FIG. 1 detached from the adaptor of the present invention.
Figure 8:
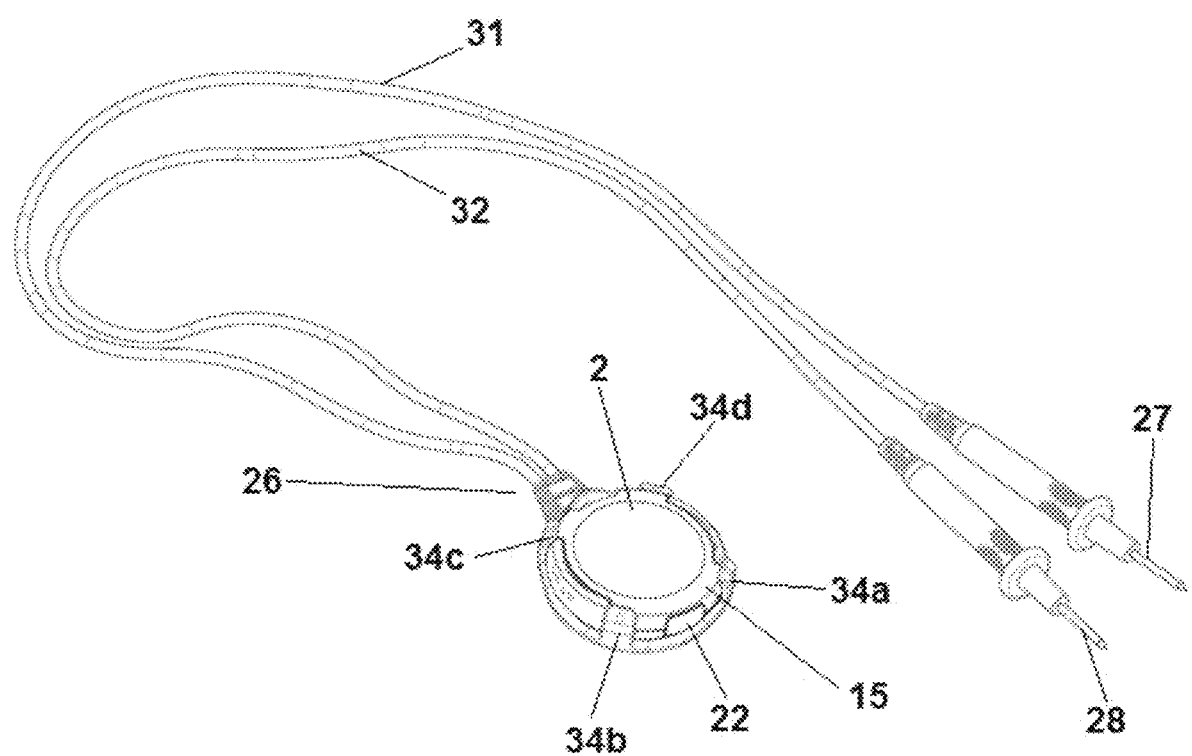
FIG. 8 illustrates the measuring device and adaptor of FIG. 7 when attached.
Figure 9:
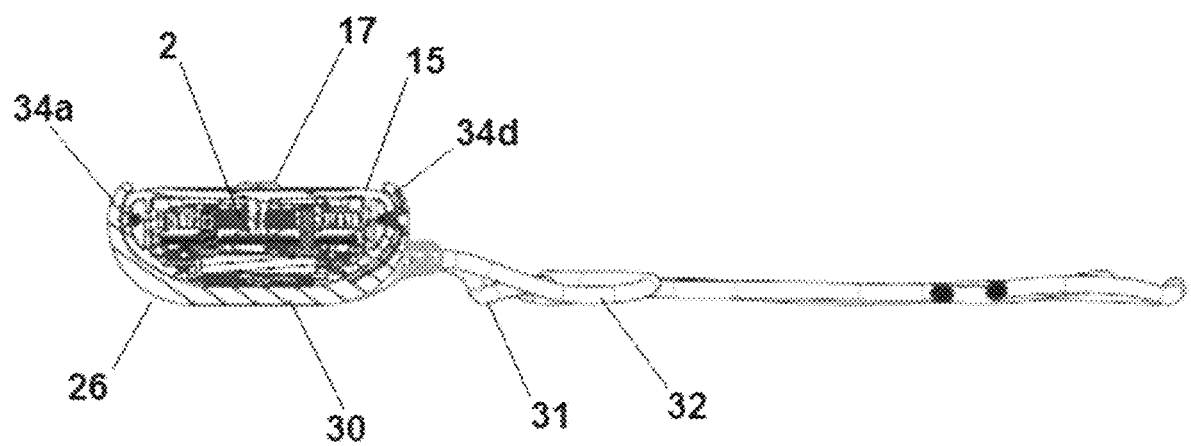
FIG. 9 illustrates in vertical cross section the measuring device and adaptor probes of FIG. 7.
Figure 10:
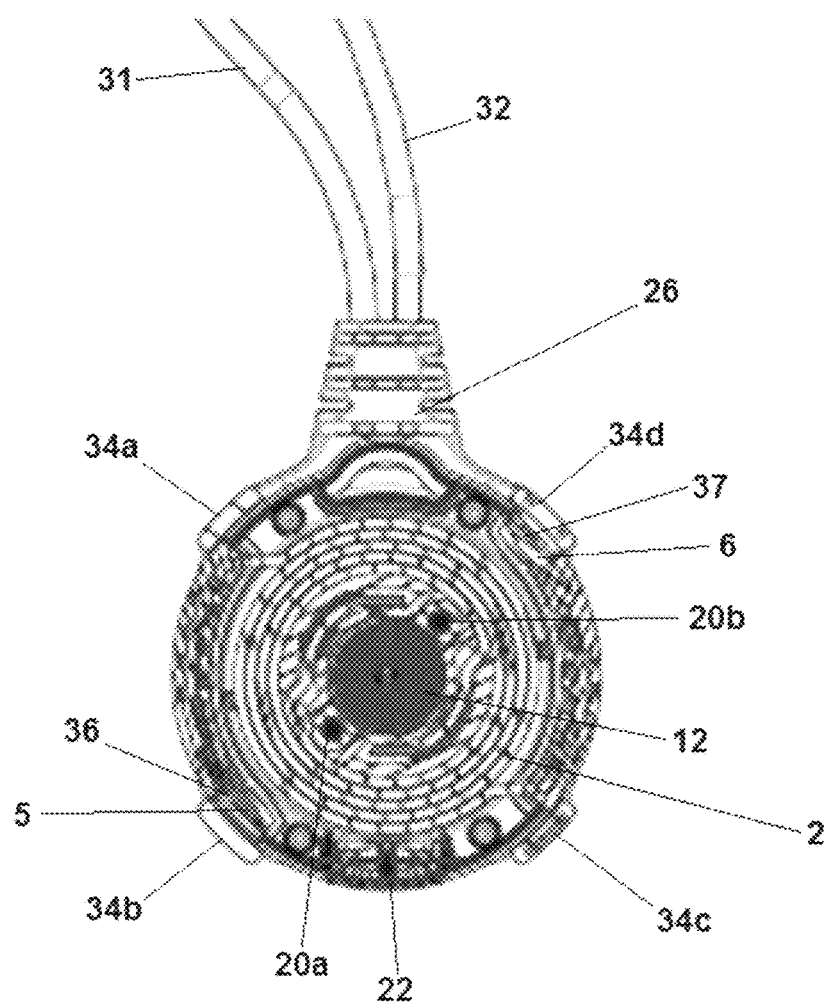
FIG. 10 illustrates in horizontal cross section, the measuring device and adaptor for the auxiliary probes of FIG. 7.

An adaptor 26 comprising a first auxiliary probe 27 and second auxiliary probe 28 can be attached to the measuring device 2 of FIG. 1 and are depicted in their detached (FIG. 7) and attached (FIG. 8) configurations. In this embodiment the auxiliary 10× probes 37, 38 are certified for electrical safety for use in measuring high voltages. Specifically, the probes 27,28 integrate high voltage ohmic resistors which step down high voltage by a factor of 10 to extra low voltage that can be measured by the device 2.

The first auxiliary probe 27 and second auxiliary probe 28 are each located at one end of their respective cables 31,32. The other end of each cable 31,32 is associated with the holder 30 and configured or exposed on the interior of the holder 30 so as to be capable of making electrical contact with the first probe 5 and second probe 6 when the measuring device 2 is located and held adjacent the holder 30.

In a preferred embodiment, the holder 30 includes a concave recess that corresponds in shape to the lower case body 16. The holder also includes flexible prongs 34a, 34b, 34c, 34d which contact the upper case body 15 and thus hold the case in a claw-like grip. Preferably the measuring device 2 is held in place in the holder 30 by interference fit or snap fit and can be readily manually attached and detached from the holder 30 without the need for a tool.

Figure 4:
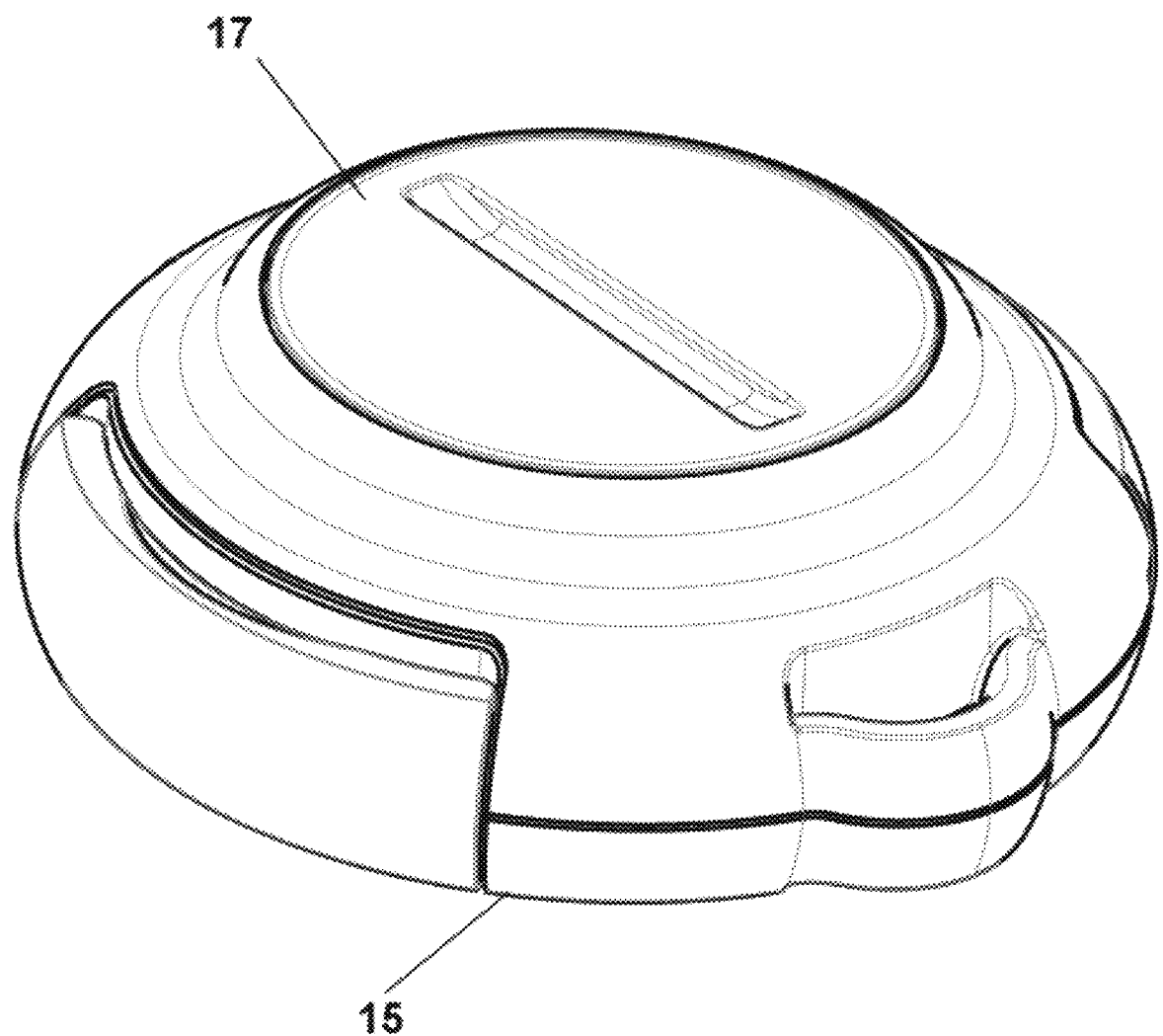
FIG. 4 illustrates a bottom view of the assembled multimeter of FIG. 1.
Figure 5:
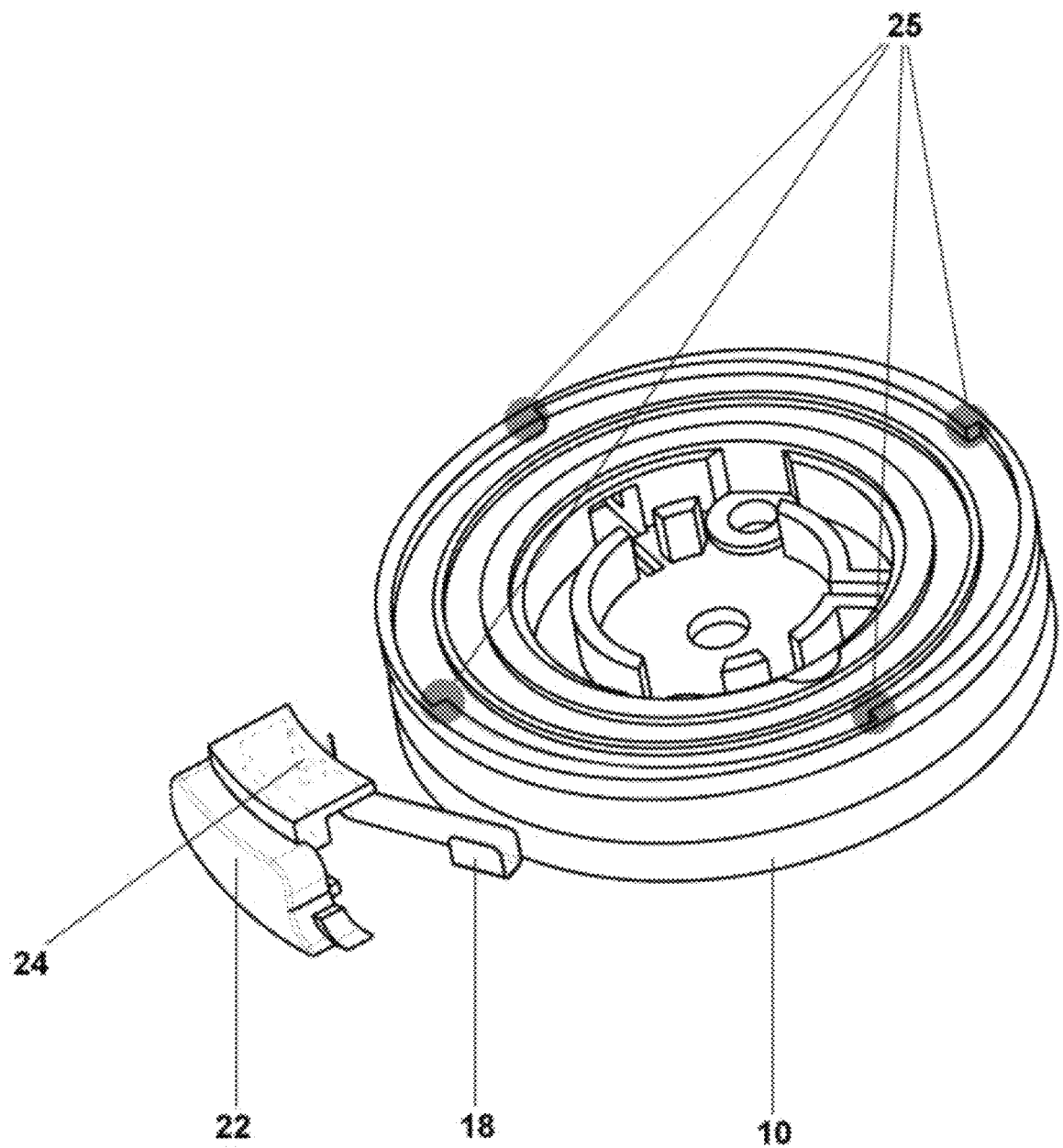
FIG. 5 illustrates the key elements of the ratchet mechanism of the multimeter of FIG. 1.
Figure 6:
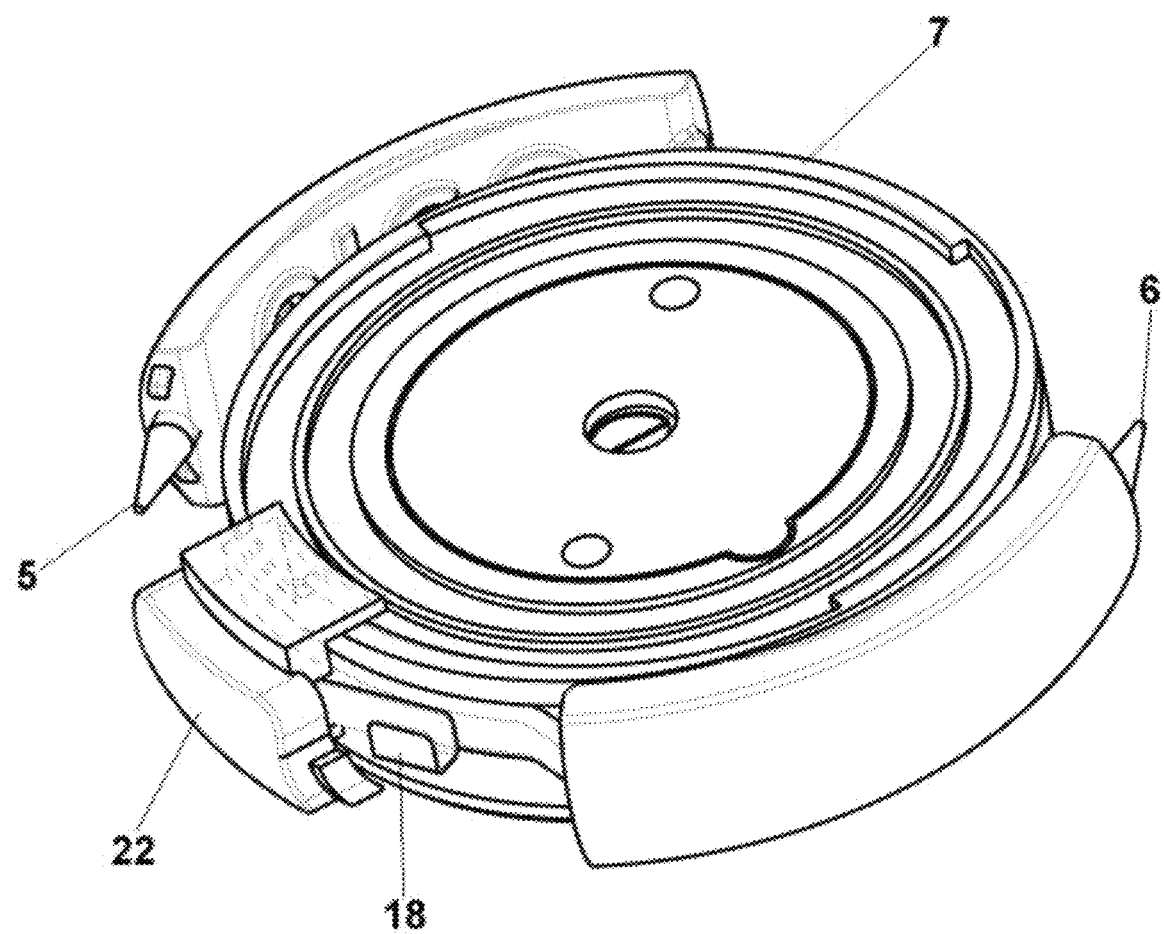
FIG. 6 illustrates the key elements of the ratchet mechanism and reel assembly of the multimeter of FIG. 1.

As illustrated in FIG. 4 when the cable 1 is retracted the first and second probes 5,6 are received into complementary shaped recesses adjacent the openings 14a, 14b in the case.

The case is a neat disk shape with no sharp or angular projections. Just enough of the first probe 5 and second probe 6 is exposed from the case to be available for electrical contact 36, 37 with the end of the first auxiliary probe cable 31 and second auxiliary probe 32 on the interior surface of the holder.

The electrical contacts 36, 37 may be made direct between the auxiliary probe cables 31, 32 and the probes 5,6. Alternatively there may be one or more intermediate parts such as a contact plates or terminals.

The electrical contact 36, 37 is typically adjacent any part of the holder 30, most preferably at the base of one or two of the flexible prongs 34a, 34b, 34c, 34d. This would also assist the user to line up the measuring device 2 and fit it into the holder 30 in a position to optimise the electrical contacts 36, 37.

This is preferable to other arrangements such as using plugs or adaptors to connect the first and second probes with the auxiliary probes which would be fiddly, time consuming and create an inconveniently long length of cables. Having the high voltage auxiliary probes 27, 28 electrically mating with respective first and second probes 5, 6 in the holder 30 allows quick and easy attachment and detachment without the inconvenience of from any excessively long cable.

Using the auxiliary cables high voltages (eg 600V) can be measured and stepped down by ohmic resistors to 60V which is readily measured by the measuring device of the present invention without the need for the device to be made large and heavier to comply with safety certification standards.

Variations within the application software, or by use of multiple software applications, the device of the present invention can be used for a range of different measurements. Optionally the probes are replaceable for different applications. In this manner a simple device that is compact and inexpensive to manufacture can be used for a wide range of tasks.

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. The described embodiments are to be considered in all respects as illustrative only and not restrictive.

Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures.

"Comprises/comprising" and "includes/including" when used in this specification is taken to specify the presence of stated features, integers, steps or components but does not preclude the presence or addition of one or more other features, integers, steps, components or groups thereof. Thus, unless the context clearly requires otherwise, throughout the description and the claims, the words 'comprise', 'comprising', 'includes', 'including' and the like are to be construed in an inclusive sense as opposed to an exclusive or exhaustive sense; that is to say, in the sense of "including, but not limited to".

The invention claimed is:

1. A measuring device, comprising a retractable assembly, the device including:
   (i) a cable comprising:
     a first end portion having a first probe; and
     a second end portion having a second probe;
   (ii) a reel comprising a rotatable hub adapted to wind up and unwind said cable;
   (iii) a circuit in connection with said cable, said circuit being adapted to wirelessly communicate a signal measured by the first probe and/or the second probe to a remote location;
   wherein the circuit is rotatable in conjunction with said rotatable hub.

2. A measuring device according to claim 1 wherein the cable comprises two lengths of cable each independently in communication with the circuit.

3. A measuring device according to claim 1 wherein the circuit is comprised in a printed circuit board.

4. A measuring device according to claim 1 which further includes:
   a central post associated with the rotatable hub and about which the reel rotates, and
   a light emitting diode adjacent the central post such that the post acts as a light guide.

5. A measuring device according to claim 1 which further includes a biasing means that urges the reel to wind up the cable, and wherein the reel comprises a rotatable cylindrical hub with at least one circular flange, and a retainer including:
   a releasable ratchet assembly to retain the reel in a releasable fixed position, said releasable ratchet assembly having:
     a pawl positioned for engagement with the reel to prevent the biasing means from urging the reel to wind up the cable when the cable is at least partly unwound;
     elastic means to bias said pawl toward said reel; and
     a pawl release to allow manual movement of the pawl out of engagement with the reel whereby the biasing means can urge the reel to wind up the cable.

6. A measuring device according to claim 1 wherein the circuit comprises:
   a processor;
   a transmitter operable for transmitting signals from the processor to a wireless compatible device at the remote location, such that signals measured by the first probe and/or the second probe are transferred wirelessly to the wireless compatible device by the transmitter; and
   a receiver operable for receiving signals from the wireless compatible device, the processor operable for receiving signals from the receiver.

7. A measuring device according to claim 1 wherein the measuring device is a multimeter.

8. A computer implemented system for measurement and presentation of a signal, comprising:
   the measuring device of claim 1 for measuring and wirelessly communicating the signal,
   a wireless compatible device at a location remote from the measuring device for receiving the signal communicated from the measuring device, and
   a software application for processing the signal and creating an output for display on a graphic user interface of the wireless compatible device.

9. An adaptor for use with the measuring device of claim 1, the adaptor comprising:
   a holder for removable attachment to the measuring device, and
   a first auxiliary probe and a second auxiliary probe,
   wherein the first auxiliary probe and second auxiliary probe are in electrical connection with the first probe and second probe of the measuring device when the holder is attached to the measuring device and the reel wound up.

* * * * *